(12) United States Patent
Purahmad et al.

(10) Patent No.: US 11,264,104 B2
(45) Date of Patent: *Mar. 1, 2022

(54) DATA STORAGE SYSTEMS AND METHODS FOR IMPROVED RECOVERY AFTER A WRITE ABORT EVENT

(71) Applicant: Western Digital Technologies, Inc., San Jose, CA (US)

(72) Inventors: Mohsen Purahmad, San Ramon, CA (US); Chao-Han Cheng, San Jose, CA (US); Dongxiang Liao, Sunnyvale, CA (US); Bo Lei, San Ramon, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/936,303

(22) Filed: Jul. 22, 2020

(65) Prior Publication Data

US 2020/0350025 A1  Nov. 5, 2020

Related U.S. Application Data

(63) Continuation of application No. 16/134,868, filed on Sep. 18, 2018, now Pat. No. 10,741,256.

(51) Int. Cl.
*G11C 16/26* (2006.01)
*G11C 16/34* (2006.01)
(Continued)

(52) U.S. Cl.
CPC ............. *G11C 16/26* (2013.01); *G11C 16/08* (2013.01); *G11C 16/10* (2013.01); *G11C 16/14* (2013.01);
(Continued)

(58) Field of Classification Search
CPC .......................... G11C 16/26; G11C 16/3495
See application file for complete search history.

(56) References Cited

U.S. PATENT DOCUMENTS 9,691,485 B1 * 6/2017 Kumar ................. G11C 16/105
2006/0285396 A1 * 12/2006 Ha ....................... G11C 29/021
365/185.33
(Continued)

*Primary Examiner* — Joseph D Torres
(74) *Attorney, Agent, or Firm* — Morgan, Lewis & Bockius LLP

(57) ABSTRACT

Apparatus, media, methods, and systems for data storage systems and methods for improved recovery after a write abort event are described. A data storage system may comprise a non-volatile memory device, having one or more wordlines configured to receive a read level voltage, and a controller. The controller is configured to detect whether a write abort event occurred for the data storage system. The controller is configured to determine a first voltage offset based on one or more of a wear-level indication of the non-volatile memory device, or one or more voltage parameters of the non-volatile memory device. The controller is configured to determine, based on the first voltage offset, an adjusted read level voltage. The controller is configured to apply the adjusted read level voltage to a wordline of the non-volatile memory device. The controller is configured to read data, based on the applied adjusted read level voltage, from the wordline of the non-volatile memory device.

20 Claims, 7 Drawing Sheets

(51) Int. Cl.
    *G11C 16/08*    (2006.01)
    *G11C 16/10*    (2006.01)
    *G11C 29/52*    (2006.01)
    *G11C 16/14*    (2006.01)
    *G11C 11/56*    (2006.01)
    *G11C 16/04*    (2006.01)

(52) U.S. Cl.
    CPC .......... *G11C 16/3495* (2013.01); *G11C 29/52* (2013.01); *G11C 11/5621* (2013.01); *G11C 11/5671* (2013.01); *G11C 16/0483* (2013.01)

(56)    References Cited

U.S. PATENT DOCUMENTS

2009/0316483 A1*  12/2009  Kim ................ G11C 16/349
                                                365/185.09
2015/0089325 A1*   3/2015  Chandrasekhar ........................
                                                H03M 13/2906
                                                714/766
2015/0135039 A1*   5/2015  Mekhanik ........... G06F 11/1072
                                                714/773
2017/0257118 A1*   9/2017  Goldenberg ....... H03M 13/1105

* cited by examiner

| Zone | WL# | Read Offset |
|---|---|---|
| Zone 1 | 00 – 10 | +0.1V |
| Zone 2 | 11 – 30 | +0.4V |
| Zone 3 | 31 – 60 | +0.3V |
| Zone 4 | 61 – 70 | +0.4V |
| Zone 5 | 71 – 80 | +0.6V |
| Zone 6 | 81 – 90 | -0.1V |
| Zone 7 | 91 – 100 | +1.2V |

FIG. 7

DATA STORAGE SYSTEMS AND METHODS FOR IMPROVED RECOVERY AFTER A WRITE ABORT EVENT

CROSS-REFERENCE TO RELATED APPLICATION

This application is a continuation of application Ser. No. 16/134,868, filed on Sep. 18, 2018, now U.S. Pat. No. 10,741,256, the entirety of which is incorporated herein by reference for all purposes.

BACKGROUND

Data storage systems may unexpectedly experience write abort events at any stage of programming. After the data storage system recovers from the write abort event, a controller of the data storage system may identify a wordline at which the data storage system can continue programming. However, utilizing a single read level voltage to identify a wordline, as the wordline where programming should be continued or resumed, results in a large number of false identification of such wordlines. The resulting false identifications increase, among others, processing cycles, power, and time in moving data from the falsely identified wordlines to other physical locations of the non-volatile memory device.

The description provided in the background section should not be assumed to be prior art merely because it is mentioned in or associated with the background section. The background section may include information that describes one or more aspects of the subject technology.

BRIEF DESCRIPTION OF THE DRAWINGS

FIG. 7 is an example table illustrating a data structure for storing voltage offset values according to illustrative implementations.

In one or more implementations, not all of the depicted components in each figure may be required, and one or more implementations may include additional components not shown in a figure. Variations in the arrangement and type of the components may be made without departing from the scope of the subject disclosure. Additional components, different components, or fewer components may be utilized within the scope of the subject disclosure.

DETAILED DESCRIPTION

The detailed description set forth below is intended as a description of various configurations of the subject disclosure and is not intended to represent the only configurations in which the subject disclosure may be practiced. The appended drawings are incorporated herein and constitute a part of the detailed description. The detailed description includes specific details for the purpose of providing a thorough understanding of the subject disclosure. However, it will be apparent to those skilled in the art that the subject disclosure may be practiced without these specific details. In some instances, structures and components are shown in block diagram form in order to avoid obscuring the concepts of the subject disclosure. Like components are labeled with identical element numbers for ease of understanding.

Figure 1:
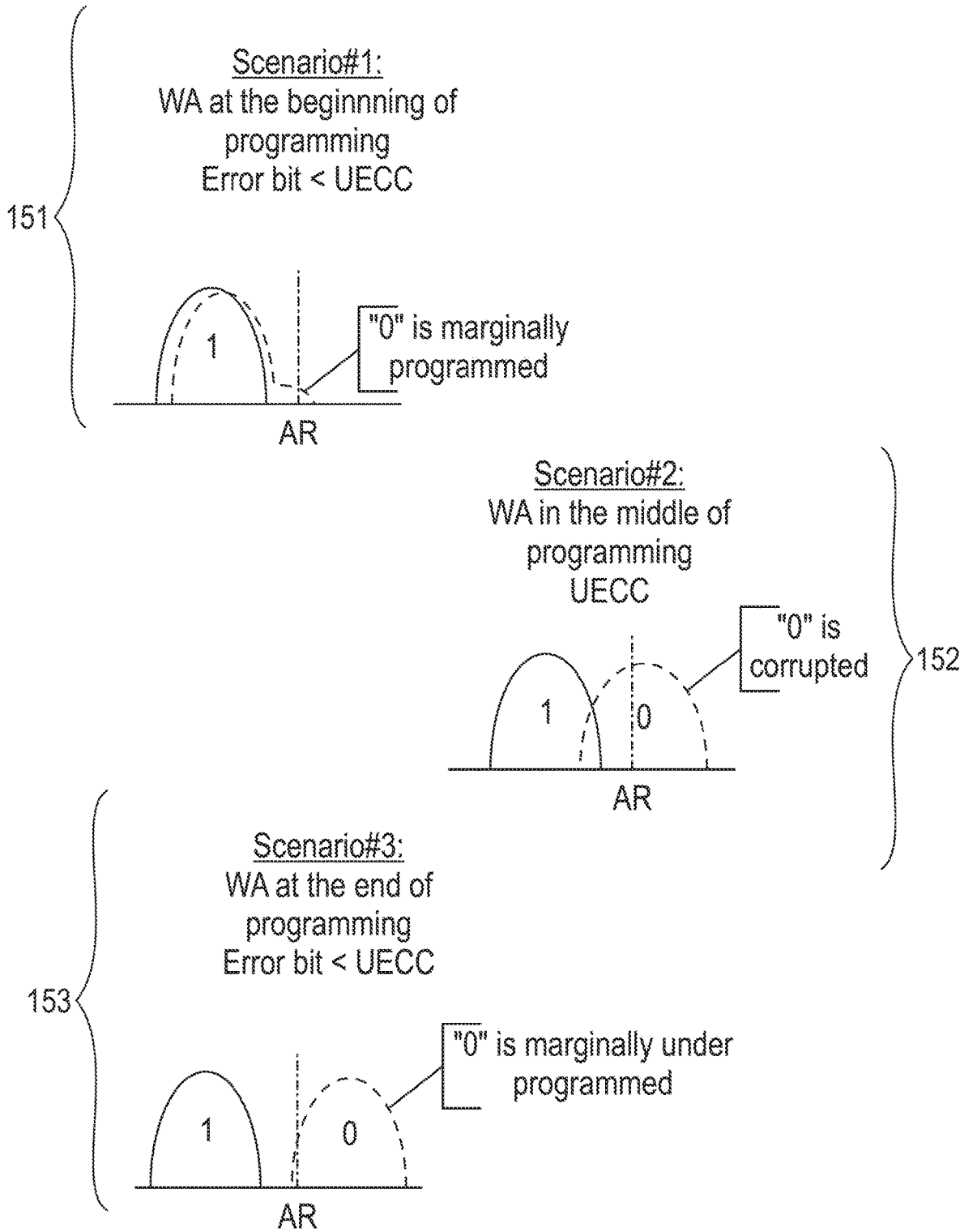
FIG. 1 depicts an example graph diagram illustrating three possible scenarios for a wordline after a write abort even occurs according to illustrative implementations.

The present description relates in general to data storage systems, and more particularly to, for example, without limitation, data storage systems and methods for improved recovery after a write abort event. Writing of data to cells or programming of cells in a non-volatile memory of a data storage system may be unexpectedly interrupted by a write abort event. An example of a write abort event may be a power loss of the data storage system. When the data storage system recovers after the write abort event occurs, a controller of the data storage system may identify a wordline within a non-volatile memory device at which the controller can begin or resume programming. This may be performed by, for example, determining whether the wordline satisfies a true erase condition. An example of a true erase condition may be that when a read operation is performed on a wordline, the number of errors detected on the wordline meets a threshold number of errors. For example, as shown in FIG. 1, after a write abort event occurs, a particular wordline may fall into one of three possible scenarios. In scenario 151, a wordline (WA) is slightly programmed due to an early write abort, and the number of error bits detected is less than a threshold number of error bits. In some implementations, a threshold number of error bits may be described as an uncorrectable error checking and correction (UECC) count. Scenario 151 may be sometimes described as a true erase condition. In scenario 152, the number of error bits detected is not less than the threshold number of error bits (or the UECC limit). In scenario 153, the number of error bits detected is less than the threshold number of error bits (or the UECC limit), but the number of cells detected when a particular sensing voltage is applied is greater than a threshold number of cells. Scenario 153 illustrates marginal programming where data is not lost.

In one or more implementations, the controller is configured to identify a wordline that meets the conditions of scenario 151 in order to avoid overhead operations of first moving data stored in the wordline to a different physical location within the non-volatile memory device and then programming or resuming the programming of data at the wordline. In one or more aspects, in order to accurately identify a wordline that satisfies the conditions of scenario 151 (e.g., a true erase condition), the read level voltage applied to the wordline needs to account for various forms of manufacturing variances that affect each non-volatile memory device. Failure to appropriately account for the variances results in false detections and over-kill problems, where a large number of wordlines may be detected as wordlines that satisfy a true erase condition.

Figure 2:
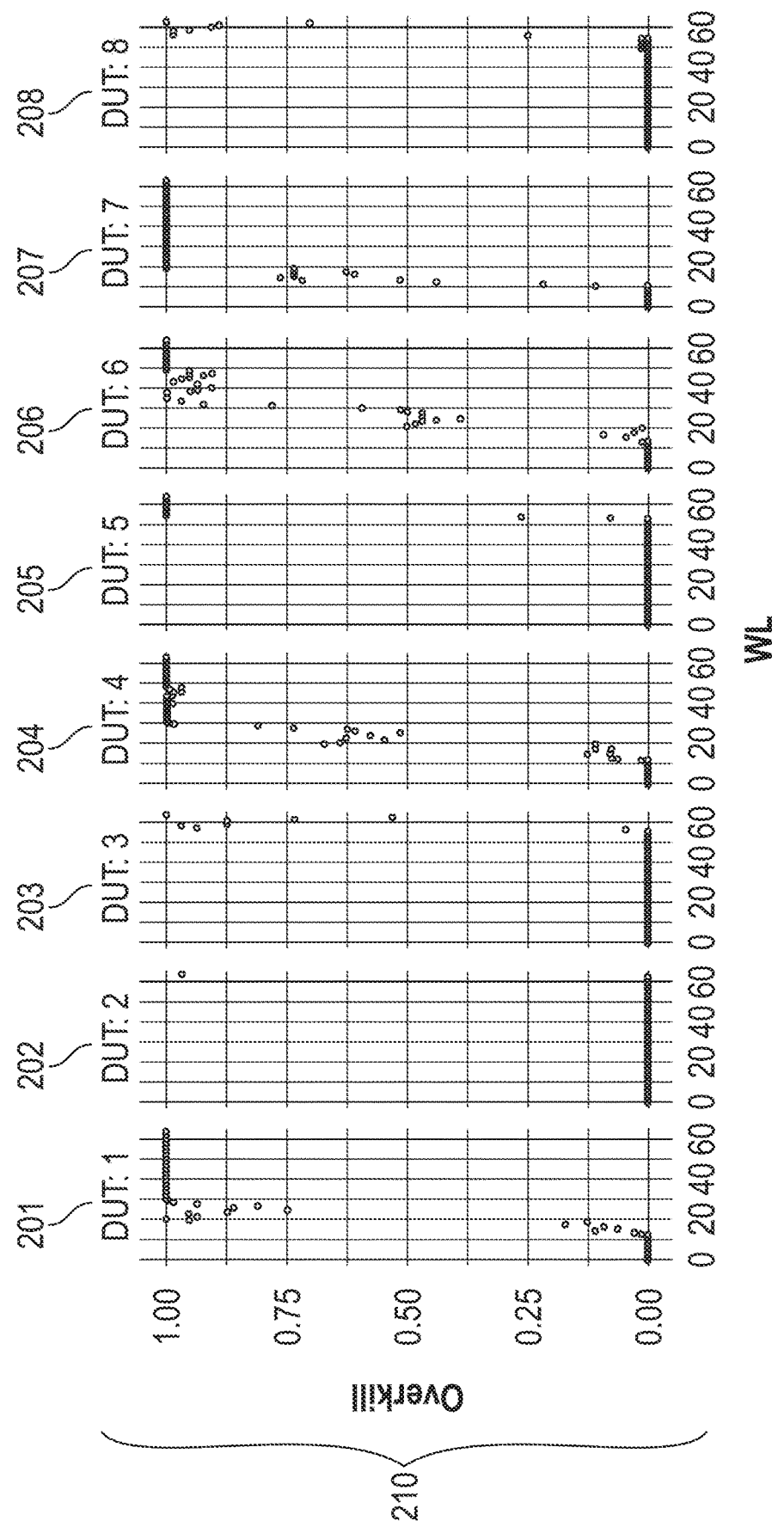
FIG. 2 depicts an example graph diagram illustrating wordline identification using a single read level voltage.
Figure 3:
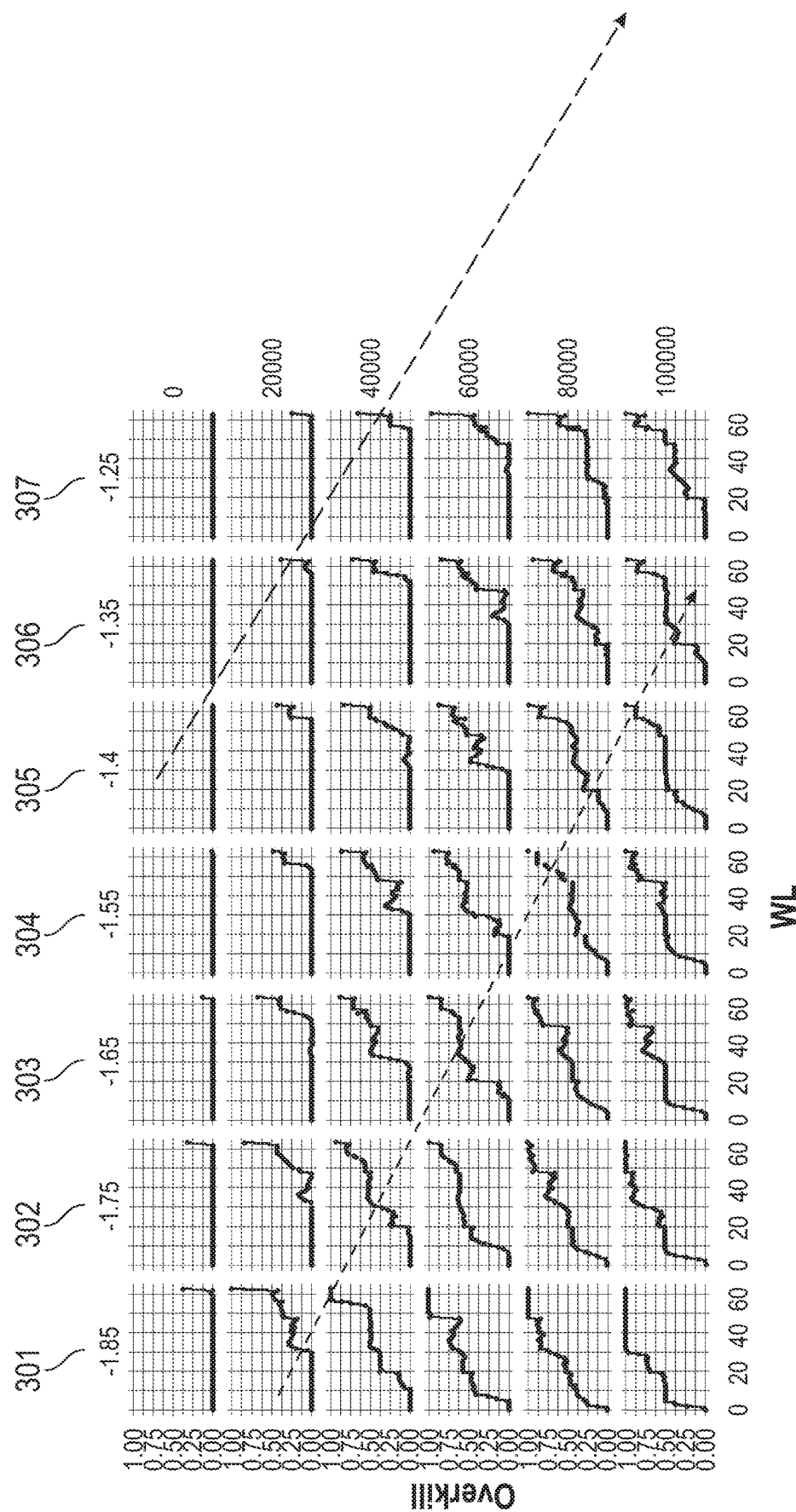
FIG. 3 depicts an example graph diagram illustrating wordline identification using multiple read level voltages according to illustrative implementation.

For example, as shown in FIG. 2, utilizing a single read-level voltage for different dies of different non-volatile memory devices 201, 202, 203, 204, 205, 206, 207, 208, results in a large number of wordlines of the non-volatile memory devices 201, 202, 203, 204, 205, 206, 207, 208, as being identified as wordlines that satisfy the true erase condition. As shown in FIG. 2, due to the variances among the dies of non-volatile memory devices, such as non-volatile memory devices 201, 202, 203, 204, 205, 206, 207, 208, utilizing a single read-level voltage for the different dies results in different wordlines and different number of wordlines being identified as wordlines that satisfy the true erase condition. However, using an adjusted read level voltage results in a more accurate identification of wordline(s) that satisfy a true erase condition. For example, as shown in FIG. 3, utilizing multiple read level voltages 301, 302, 303, 304, 305, 306, 307, where the read level voltages account for even a single condition affecting the wordline, such as the program/erase (P/E) cycle count of the memory blocks of the wordlines, improves the accuracy of detecting the wordlines that satisfy the true erase condition, and as shown in FIG. 3, reduces the over-kill problem of falsely identifying a large number of wordlines as wordlines that satisfy a true erase condition. Additional details of the determining adjusted read level voltages to more accurately identify wordlines that satisfy true erase conditions are described in detail below and herein.

Figure 4:
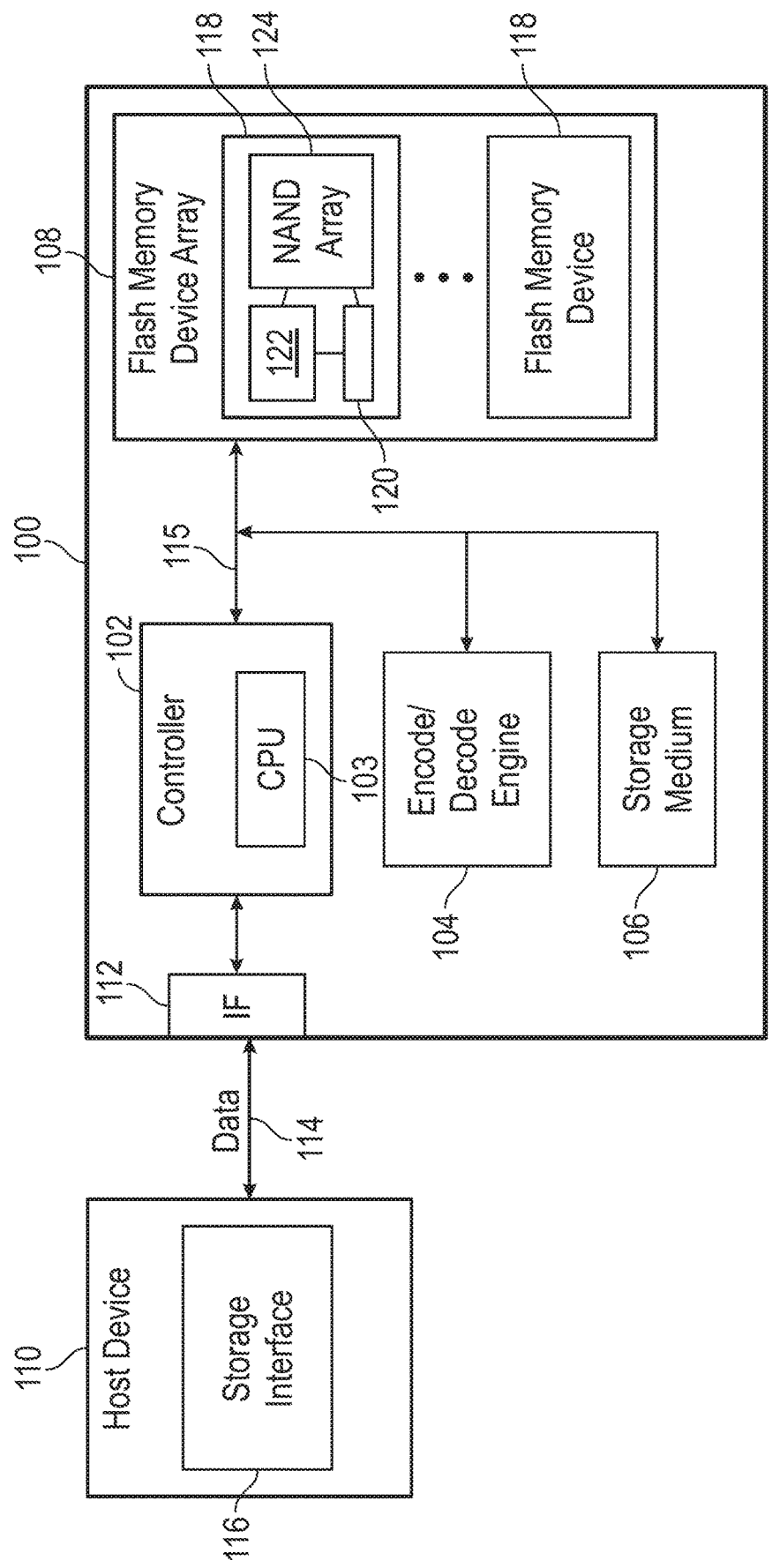
FIG. 4 is a block diagram illustrating components of a data storage system according to illustrative implementations.

FIG. 4 is a block diagram depicting example components of a data storage system 100, according to one or more aspects of the subject technology. Data storage system 100 includes, among other things, controller 102, encode/decode engine 104, storage medium 106, and non-volatile memory device array 108. As depicted in FIG. 4, data storage system 100 may be connected to a host device 110 via host interface 112.

Controller 102 may include several internal components (not shown) such as one or more processors 103, a read-only memory, a non-volatile component interface (for example, a multiplexer to manage instruction and data transport along a connection to non-volatile memory device array 108), an I/O interface, error correction circuitry, and the like. A processor of controller 102 may monitor and control the operation of the components in data storage controller 102. The processor and/or controller 102 may be a multi-core processor, a general-purpose microprocessor, a microcontroller, a digital signal processor (DSP), an application specific integrated circuit (ASIC), a field programmable gate array (FPGA), a programmable logic device (PLD), a controller, a state machine, gated logic, discrete hardware components, or a combination of the foregoing. In some implementations, one or more elements of controller 102 may be integrated into a single chip. In some implementations, the elements may be implemented on two or more discrete components.

Controller 102 may execute code or instructions to perform the operations and functionality described herein. For example, controller 102 may perform operations for managing request flow and address mappings, and to perform calculations and generate commands. One or more sequences of instructions may be stored as firmware on memory within controller 102. One or more sequences of instructions may be software stored and read from storage medium 106, non-volatile memory device array 108, or received from host device 110 (for example, via host interface 112). Storage medium 106 and non-volatile memory device array 108 include examples of machine or computer readable media on which instructions/code executable by controller 102 may be stored. Machine or computer readable media may generally refer to any tangible and non-transitory medium or media used to provide instructions to controller 102, including both volatile media, such as dynamic memory used for storage media or for buffers within controller 102, and non-volatile media, such as electronic media, optical media, and magnetic media. The operations and functionality described herein also may be implemented in hardware using logic circuits, for example, or a combination of hardware and software/firmware.

In some aspects, storage medium 106 represents the volatile memory used to temporarily store data and information used to manage data storage system 100. According to aspects of the present disclosure, storage medium 106 is a random access memory (RAM) such as double data rate (DDR) RAM. Other types of RAM also may be used to implement storage medium 106. Storage medium 106 may be implemented using a single RAM module or multiple RAM modules. While storage medium 106 is depicted as being distinct from controller 102, it is understood that storage medium 106 may be incorporated into controller 102 without departing from the scope of the present disclosure. Alternatively, storage medium 106 may be a non-volatile memory such as a magnetic disk, flash memory, peripheral SSD, and the like.

Host interface 112 may be coupled to host device 110, to receive data from and send data to host device 110. Host interface 112 may include both electrical and physical connections for operably coupling host device 110 to controller 102. Host interface 112 may communicate data, addresses, and control signals between host device 110 and controller 102. In this manner, controller 102 may store data received from host device 110 in non-volatile memory device array 108 in response to a write command from host device 110, and to read data stored in non-volatile memory device array 108 and to transfer the read data to host device 110 via host interface 112 in response to a read command from host device 110.

Host device 110 represents any device that may be coupled to data storage system 100 and to store data in data storage system 100. Host device 110 may be a computing system such as a personal computer, a server, a workstation, a laptop computer, PDA, smart phone, and the like. Alternatively, host device 110 may be an electronic device such as a digital camera, a digital audio player, a digital video recorder, and the like.

As further depicted in FIG. 4, host device 110 and data storage system 100 may be in communication with each other via a bus 114. The bus may use suitable interfaces standard including, but not limited to, serial advanced technology attachment (SATA), advanced technology attachment (ATA), small computer system interface (SCSI), PCI-extended (PCI-X), fiber channel, serial attached SCSI (SAS), secure digital (SD), embedded multi-media card (EMMC), universal flash storage (UFS) and peripheral component interconnect express (PCIe). According to some aspects, data storage system 100 may include pins (or a socket) to mate with a corresponding socket (or pins) on host device 110 to establish an electrical and physical connection.

Controller may include an internal system bus 115. System bus 115 may include a combination of a control bus, address bus, and data bus, and connect the components of controller 102 (e.g., a processor and/or memory therein) with other components of data storage system 100, including encode/decode engine 104, storage medium 106, non-volatile memory device array 108, and host interface 112. Data is transferred between the various components over system bus 115. System bus 115 may reside partially external and partially internal to controller 102.

Host device 110 and data storage system 100 may be in communication with each other via a wired or wireless connection and may be local to or remote from one another. According to one or more other aspects, data storage system 100 (or host interface 112) includes a wireless transceiver to place host device 110 and data storage system 100 in wireless communication with each other.

Controller 102 may receive data and/or storage access commands from a storage interface module 116 (e.g., a device driver) of host device 110. Storage access commands communicated by the storage interface module 116 may include read and write commands issued by the host device 110. Read and write commands may specify a logical address, e.g., logical block addresses (LBAs) used to access data stored in the data storage system 100. Controller 102 may execute commands in the non-volatile memory device array 108 in response to commands received from storage interface module 116.

Non-volatile memory device array 108 may include multiple non-volatile memory devices 118. A non-volatile memory device 118 represents a non-volatile memory device for storing data. According to aspects of the subject technology, non-volatile memory device 118 includes, for example, a NAND flash memory. Each non-volatile memory device 118 may include a single non-volatile memory chip or die, or may include multiple non-volatile memory chips or die. For example, within non-volatile memory device array 108, some of the non-volatile memory devices 118 may comprise one non-volatile die while others may comprise more than one non-volatile die. Non-volatile memory device 118 is not limited to any particular capacity or configuration. For example, the number of physical blocks, the number of physical pages per physical block, the number of sectors per physical page, and the size of the sectors may vary within the scope of the subject technology.

Non-volatile memory devices 118 may be arranged in multiple channels, with each channel having one or more non-volatile memory devices 118. A non-volatile memory device 118 may include one or more non-volatile memory interfaces (not shown). Each non-volatile memory interface interfaces the controller 102 to one of the non-volatile memory devices via a corresponding channel. Each of the channels (not shown) may be implemented using one or more physical I/O buses coupled between one of the non-volatile memory interfaces and the corresponding non-volatile device(s). Each channel allows the corresponding non-volatile memory interface to send read, write and/or erase commands to the corresponding non-volatile memory device. Each non-volatile memory interface may include a register (e.g., First-In-First-Out (FIFO) register) that queues read, write and/or erase commands from the controller 102 for the corresponding non-volatile memory device. Although the term "channel," as used above, referred to the bus coupled between a non-volatile memory interface and the corresponding non-volatile memory device, the term "channel" may also refer to the corresponding non-volatile memory device that is addressable through a bus (e.g., system bus 115).

Non-volatile memory device 118 may have a standard interface specification. This standard ensures that chips from multiple manufacturers can be used interchangeably. The interface of non-volatile memory device 118 may be used to access internal registers 120 and an internal non-volatile memory controller 122. In some implementations, registers 120 may include address, command, and/or data registers, which internally retrieve and output the necessary data to and from a NAND memory cell array 124. By way of example, memory cell array 124 may comprise a single-level cell (SLC) memory, a multi-level cell (MLC) memory, a three-level cell (TLC) memory device, etc. In some aspects, the non-volatile memory device array 108 may comprise one or more hybrid memory devices that may function in one or more of a SLC, MLC or TLC mode. Other types of non-volatile memory such as 3D NAND flash memory also are contemplated in the subject technology.

Data register (e.g., of registers 120) may include data to be stored in memory cell array 124, or data after a fetch from memory cell array 124, and may also be used for temporary data storage and/or act like a buffer. An address register may store the memory address from which data will be fetched to host device 110 or the address to which data will be sent and stored. In some aspects, a command register is included to control parity, interrupt control, and the like. In some aspects, internal non-volatile memory controller 122 is accessible via a control register to control the general behavior of non-volatile memory device 118. Internal non-volatile controller 122 and/or the control register may control the number of stop bits, word length, receiver clock source, and may also control switching the addressing mode, paging control, co-processor control, and the like.

Encode/decode engine 104 represents one or more components that may encode and/or decode code words to be stored in and/or read from the non-volatile memory device array 108. Encode/decode engine 104 may include an encoder and a decoder. The decoder may include a hard decoder and a soft-decision ECC decoder. Encode/decode engine 104 may encode data received from host device 110 and decode code words read from the non-volatile memory device 118 before sending the decoded data to the host. In some implementations, encode/decode engine 104 may comprise one or more memory devices and/or one or more processing units used to perform error correction (e.g., using LDPC, BCH, or turbo codes). Encode/decode engine 104 may also include a soft information module that determines and/or maintains soft metric inputs for encoding and decoding operations. While encode/decode engine 104 is depicted as being distinct from controller 102, it is understood that encode/decode engine 104 may be incorporated into controller 102 without departing from the scope of the present disclosure.

As described above, a more accurate read level voltage can be applied to improve accuracy of determining whether a particular wordline satisfies a true erase condition. The controller 102 may be configured to determine a more accurate read level voltage by adjusting a read level voltage of a non-volatile memory device, such as the non-volatile memory device 118. The controller 102 may be configured to determine one or more voltage offsets to account for various forms of variances that may exist between two or more non-volatile memory devices. Examples of the various forms of variances include, but are not limited to, variances between wordlines of a memory block, and/or variances among dies of the non-volatile memory devices 118 included in the non-volatile memory device array 108, which cause different operating and/or wear-level conditions or indications, such as program/erase cycle count, to have different effects on the performance of different dies of the non-volatile memory devices 118 included in the non-volatile memory device array 108. For example the controller 102 may determine a voltage offset for variances between wordlines of a memory block. Similarly the controller 102 may determine a voltage offset for a program/erase cycle count of a die of a non-volatile memory device 118, and a voltage offset for variances between dies of non-volatile memory devices 118 in a non-volatile memory device array 108. In some implementations, the controller 102 may be configured to determine a voltage offset for a program/erase cycle count of a die of a non-volatile memory device 118, and a different voltage offset for the same program-erase cycle count of a different die of a non-volatile memory device 118.

The controller 102 may be configured to determine one or more voltage offsets based on values that were selected as a result of testing performed on sample dies of the non-volatile memory devices 118. For example, voltage offset values may be selected based on testing performed on wordlines of sample dies of non-volatile memory devices 118, and these voltage offsets may be stored in a data structure, such as a table, stored in a data storage unit of the non-volatile memory device, such as in the memory cell array 124 of the non-volatile memory device 118. In some implementations, each wordline may be associated with a wordline zone and a voltage offset may be selected for a wordline zone. For example, if there are 64 wordlines in a memory block, and if 8 wordlines or a maximum of 8 wordlines are to be associated with a zone, then 8 zones may be created for the 64 wordlines, with each zone being associated with 8 wordlines, and a voltage offset may be selected for each of the 8 zones. The controller 102 may be configured to determine, based on the data structure stored in the memory cell array 124, a wordline zone for a wordline and the corresponding voltage offset value based on the wordline zone.

The controller 102 may be configured to determine one or more voltage offsets based on data utilized for management of the data storage system 100, the non-volatile memory devices 118, and/or the like. Examples of data utilized for management of the data storage system 100 include, but are not limited to, wear level indication data, such as program/erase (P/E) cycle count. In some implementations P/E cycle count data for a memory block may be stored in a data memory cell array 124 of the non-volatile memory device 118, and different voltage offset values may be selected for different P/E cycle counts, and the association between different voltage offset values and different P/E cycle counts may be stored in a memory cell array 124. The controller 102 may be configured to identify a voltage offset value based on the association between P/E cycle count and corresponding stored voltage offset value.

Furthermore, the controller 102 may be configured to determine one or more voltage offsets based on characteristic parameter values selected during die-sort stage of the manufacturing of the die of a non-volatile memory device 118. These selected values may be calibrated to account for the manufacturing variance of the die. Examples of the characteristic parameters include, but are not limited to, voltage parameters of a non-volatile memory device 118, such as the programming voltage parameter, the erase voltage parameter, and the like. The controller 102 may be configured to determine a voltage offset based on the values of the characteristic parameters.

Figure 5:
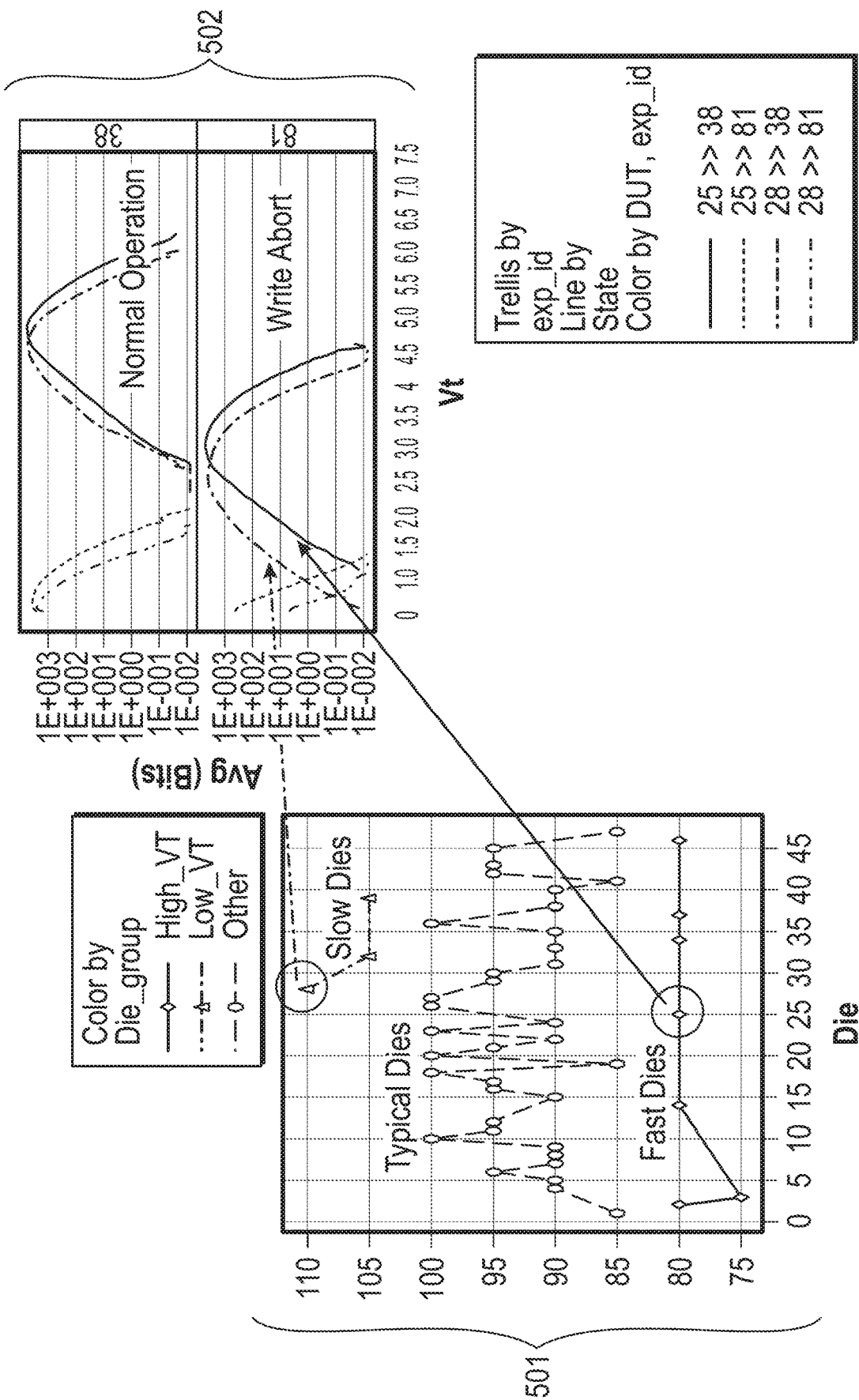
FIG. 5 depicts example graph diagrams illustrating read level voltage differences between slow dies and fast dies according to illustrative implementations.

In some implementations, the controller 102 may associate a die of a non-volatile memory device 118 with a type of die, such as a slow die, a fast die, and the like, and determine a voltage offset based on type of die associated with the die. For example, as shown in FIG. 5, after a write abort event occurs, a slow die generally requires a larger read level voltage to be applied to accurately read data than a fast die. In some implementations, each of the slow dies may have a different read level voltage to be applied to accurately read data. In some implementations, each of the fast dies may have a different read level voltage to be applied to accurately read data. Thus, in some implementations, each die, or each slow die or fast die may have optimal read level voltages that are different from another die. In some implementations, some of the slow dies may have a same or similar read level voltage and some of the slow dies may have a different read level voltage. In some implementations, some of the fast dies may have a same or similar read level voltage and some of the fast dies may have a different read level voltage. Additional details of associating a die with a type of die, and determining voltage offset values based on wordline to wordline variance, operating or wear-level indications and/or conditions, such as program-erase cycle count, of different dies of the non-volatile memory devices 118 and/or other die to die variances are described with reference to FIG. 6.

Figure 6:
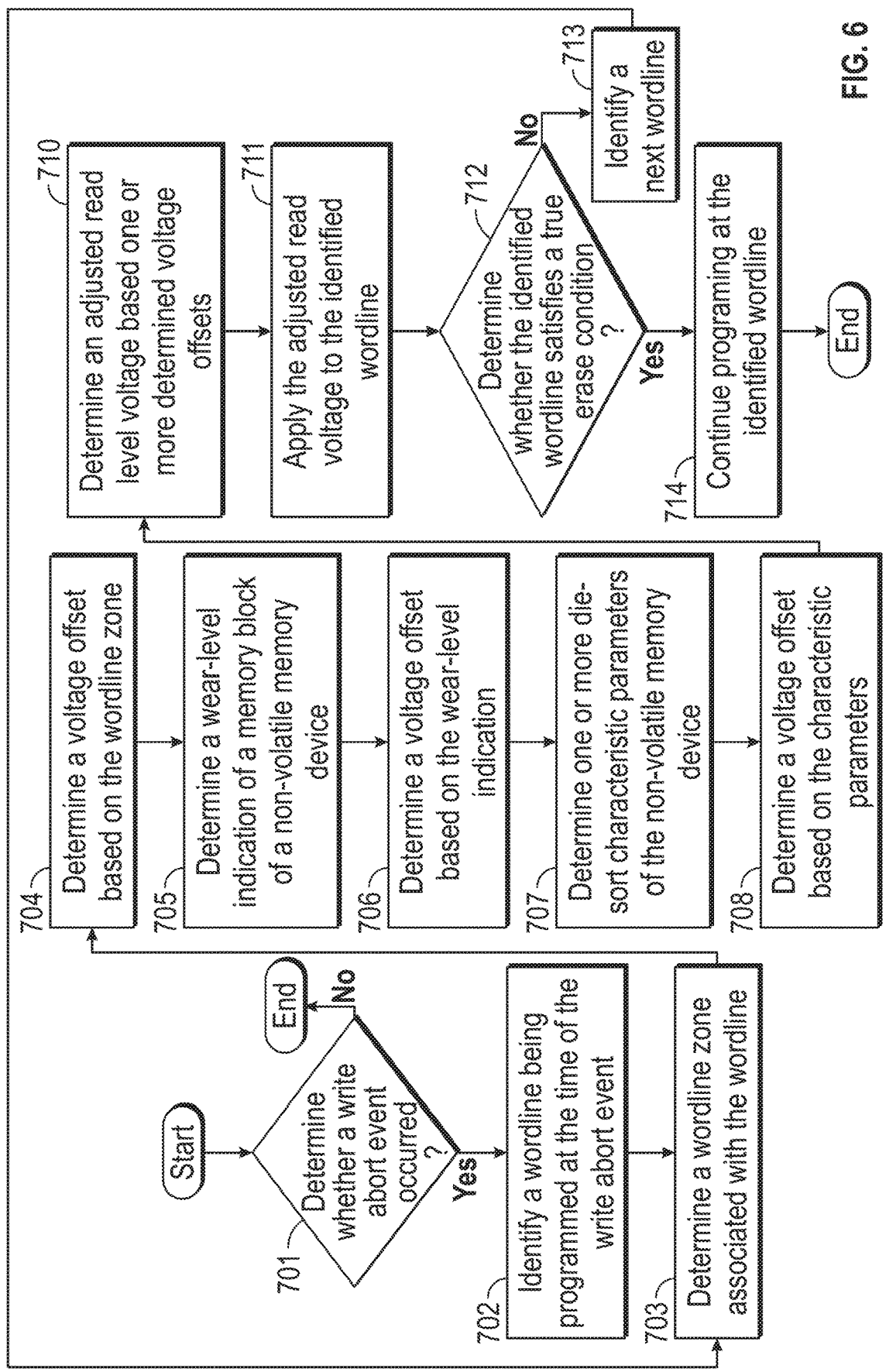
FIG. 6 is a flow chart of an example method of determining whether a wordline satisfies a true erase condition according to illustrative implementations.

Turning now to FIG. 6, there is shown a flowchart illustrating a process of true erase detection of a wordline after occurrence of a write abort event. For the purpose of illustrating a clear example, components of the data storage system 100 shown and described with reference to FIG. 4 will be used to describe the process of detecting whether a wordline satisfies a true erase condition. The method 700 includes determining (by a controller of a data storage system, such as the controller 102 of the data storage system 100) whether a write abort event occurred in the data storage system 100 (block 701). As described above, the controller 102 may determine whether a write abort event occurred at power up of the data storage system after the write abort event occurred. The controller 102 may determine whether a write abort event occurred based on log data stored in the data storage system 100. In some implementations, the data storage system 100 (e.g., the controller 102) may determine whether a write abort event occurred based on one or more values in one or more registers in the data storage system.

If the controller 102 determines that a write abort event did not occur, then the process continues to end of method 700. If the controller 102 determines that a write abort event occurred, then the controller 102 identifies a wordline that was being programmed when the write abort event occurred (block 702). The controller 102 may identify a wordline that was being programmed at the time when the write abort event occurred based on log data stored in the data storage system 100. In some implementations, the controller 102 may identify a wordline based on information related to the log data stored in the data storage system 100. The log pointer information may comprise information related to a memory block of a non-volatile memory device of a data storage system 100. For example, the log pointer may indicate a particular position within a memory block in a non-volatile memory device of the data storage system 100. The log pointer information may provide information related to the memory block. For example, the log pointer information may indicate that the memory block is an open memory block.

The log pointer information may comprise information related to a certain position within the memory block. The position may correspond to a certain wordline within the memory block. The controller 102 may be configured to identify the wordline that was being programmed or was about to be programmed by searching and/or identifying wordlines from the position indicated by the log pointer to the end of the memory block and performing read operations on one or more of the wordlines. For example, the controller 102 may perform read operations on each of the wordlines searched and/or identified from the position indicated by the log pointer to the end of the memory block. In some implementations, the controller 102 may be configured to identify the wordline that was being programmed or was about to be programmed based on an erase bitmap associated with a particular memory block.

The controller 102 determines a wordline zone associated with the wordline (block 703). Each wordline in memory blocks of the non-volatile memory device may be associated with a wordline zone. The associations between the wordlines and the wordline zones may be stored in a data structure in a data storage unit. For example, the associations may be stored in a table data structure, as shown in FIG. 7, and the table data structure may be stored in a data storage unit. The controller 102 may be configured to determine the wordline zone based on the data structure storing the associations between a wordline and a wordline zone. For example, the controller 102 may be configured to search the data structure using a wordline identifier, such as the wordline number, and retrieving the corresponding wordline zone stored in the data structure for the wordline.

The controller 102 determines a voltage offset based on the wordline zone (block 704). Each wordline zone may be associated with a voltage offset, and the associations between the wordline zones and the voltage offsets may be stored in a data structure stored in a memory or data storage unit. An example of such a data structure is shown in FIG. 7. The controller 102 may determine a voltage offset for a wordline zone by searching the data structure using the wordline zone and retrieving the associated voltage offset stored in the data structure for that wordline zone.

The controller 102 determines a wear-level indication of a memory block of a non-volatile memory device that includes the identified wordline (block 705). As described above, an example of a wear-level indication of the memory block of the non-volatile memory device may be the program/erase (P/E) count of the memory block that includes the wordline. The program/erase count may be stored in a data storage unit, such as a register, of the data storage system 100, and the controller 102 may be configured to access or retrieve the program-erase count based on the wordline. The controller 102 determines a voltage offset (e.g., a second voltage offset) based on the wear-level indication (block 706). Each wear-level indication may be associated with a certain voltage offset. In some implementations, a set of rules may be stored in a memory that specifies different voltage offsets for different wear-level indications. In some implementations, the set of rules may specify different voltage offsets for different levels of a wear-level indication. For example, the set of rules may specify 0.4 volts of voltage offset for a P/E count of 25,000 P/E cycles and a 0.9 volts of voltage offset for a P/E count of 50,000 P/E cycles. In some implementations, associations between the voltage offsets and wear-level indications may be stored in a data structure stored in a memory or data storage unit. For example, a table comprising multiple entries with the entries comprising different P/E cycle counts and their associated voltage offsets. The controller 102 may be configured to determine a voltage offset for a wear-level indication based on the values stored in the data structure.

The controller 102 determines one or more die-sort characteristic parameters of the non-volatile memory device that includes the identified wordline (block 707). As described above, examples of die-sort characteristic parameters may include but are not limited to voltage parameters of the non-volatile memory device. For example, a die-sort characteristic parameter may be a programming voltage parameter. Similarly, another die-sort characteristic parameter may be an erase voltage parameter, and the like. As described above, the values of the die-sort characteristic parameters may be specified or selected during the die-sort phase of the manufacturing of the die of the non-volatile memory device that includes the identified wordline.

The controller 102 determines a voltage offset based on the one or more die-sort characteristic parameters of the non-volatile memory device that includes the wordline (block 708). In some implementations, the controller 102 may be configured to calculate one or more statistical measurements based on the one or more die-sort characteristic parameters, and identify a voltage offset based on the calculated statistical measurement. For example, the controller 102 may calculate a difference between a programming voltage parameter and an erase voltage parameter, and identify a voltage offset based on the calculated difference between the programming voltage parameter and the erase voltage parameter. In some implementations, multiple statistical measurements may be associated with multiple voltage offsets. For example, a first range of values that represent possible differences between programming voltage parameter values and erase voltage parameter values may be associated with a first voltage offset, and a second range of values that represent differences between the programming voltage parameter values and the erase voltage parameter values may be associated with a second voltage offset, and the like.

In some implementations, as described above, the controller 102 may be configured to determine a category for the die of the non-volatile memory device that includes the identified wordline, and determine a voltage offset based on the category of the die. Each category of die may be associated with a voltage offset and the associations may be stored in data structure, such as a table, stored in a memory or data storage unit. For example, if a calculated difference between a programming voltage parameter and an erase voltage parameter of the die satisfies a threshold value for a slow die, then the controller 102 determines that the category of the die is a slow die, and determines the voltage offset based on an entry for a voltage offset for slow die in the data structure. In some implementations, a set of rules, stored in a memory, may specify different voltage offsets for different categories of die, and the controller 102 may determine a voltage based on determined category for the die.

The controller 102 determines an adjusted read level voltage based on one or more of the determined voltage offsets (block 710). The one or more of the determined voltage offsets may be, for example, one, some or all of the voltage offsets determined at blocks 704, 706 and 708. The controller 102 may be configured to determine the adjusted read level voltage by determining a current read level voltage and/or a default read level voltage for the non-volatile memory device, and adjusting the current read level voltage by the determined voltage offsets. In some implementations, the controller 102 may be configured to adjust a read level voltage by combining the current read level voltage with one or more of the determined voltage offsets. For example, the controller 102 may be configured to add one or more of the determined voltage offsets to the current read level voltage. The controller 102 applies the adjusted read level voltage to the identified wordline to perform a read operation (block 711).

The controller 102 determines whether the identified wordline satisfies a true erase condition (block 712). As described above, the controller 102 performs a read operation applying the adjusted read level voltage and determines a number of errors based on the data read from the identified wordline. The controller 102 may be configured to determine whether the identified satisfies a specified true erase condition based on the number of errors determined from the read operation. For example, if the number of errors determined is less than a threshold number of errors then the controller 102 may be configured to determine that the identified wordline satisfies the true erase condition. Similarly if the number of errors determined does not satisfy the threshold number of errors, then the controller 102 may be configured to determine that the identified wordline does not satisfy the true erase condition. If the controller 102 determines that the identified wordline does not satisfy the true erase condition, then the controller 102 identifies a next wordline (block 713). If the controller 102 determines that the identified wordline satisfies the true erase condition, then the controller 102 continues programming at the identified wordline (block 714).

The blocks of the flowchart illustrated in FIG. 6 have been described as occurring sequentially. The subject technology is not limited to the described sequential performance of the illustrated process. One or more of the blocks may be performed in parallel with other blocks in the illustrated process. Other variations in the illustrated process are within the scope of the subject technology.

Various examples of aspects of the disclosure are described below. These are provided as examples, and do not limit the subject technology.

In one or more implementations, a computer-implemented method includes detecting whether a write abort event occurred for the data storage system, wherein the data storage system is configured to apply a read level voltage to a wordline of a non-volatile memory device. The method includes, in response to detecting that the write abort event occurred, determining a first voltage offset based on one or more of a wear-level indication of the non-volatile memory device, or one or more voltage parameters of the non-volatile memory device. In response to detecting that the write abort event occurred, the method includes determining, based on the first voltage offset, an adjusted read level voltage. The method includes, in response to detecting that the write abort event occurred, applying the adjusted read level voltage to the wordline of the non-volatile memory device. The method includes, in response to detecting that the write abort event occurred, reading data, based on the applied adjusted read level voltage, from the wordline of the non-volatile memory device.

In one or more implementations, a data storage system includes a non-volatile memory device, having one or more wordlines configured to receive a read level voltage, and a controller. The controller is configured to detect whether a write abort event occurred for the data storage system. The controller is configured to determine a first voltage offset based on one or more of a wear-level indication of the non-volatile memory device, or one or more voltage parameters of the non-volatile memory device. The controller is configured to determine, based on the first voltage offset, an adjusted read level voltage. The controller is configured to apply the adjusted read level voltage to a wordline of the non-volatile memory device. The controller is configured to read data, based on the applied adjusted read level voltage, from the wordline of the non-volatile memory device.

In one or more implementations, a data storage system includes a non-volatile memory device. The data storage system includes a means for detecting whether a write abort event occurred for the data storage system. In response to detecting that the write abort event occurred, the data storage system includes a means for determining a first voltage offset based on one or more of a wear-level indication of a non-volatile memory device, or one or more voltage parameters of the non-volatile memory device. In response to detecting that the write abort even occurred, the data storage system includes a means for determining, based on the first voltage offset, an adjusted read level voltage. In response to detecting that the write abort even occurred, the data storage system includes a means for applying the adjusted read level voltage to a wordline of the non-volatile memory device. In response to detecting that the write abort even occurred, the data storage system includes a means for reading data, based on the applied adjusted read level voltage, from the wordline of the non-volatile memory device.

In one or more implementations, a non-transitory machine-readable medium includes machine-executable instructions thereon that, when executed by a processor, perform a method. The method includes detecting whether a write abort event occurred for the data storage system, wherein the data storage system is configured to apply a read level voltage to a wordline of a non-volatile memory device. The method includes, in response to detecting that the write abort event occurred, determining a first voltage offset based on one or more of a wear-level indication of the non-volatile memory device, or one or more voltage parameters of the non-volatile memory device. In response to detecting that the write abort event occurred, the method includes determining, based on the first voltage offset, an adjusted read level voltage. The method includes, in response to detecting that the write abort event occurred, applying the adjusted read level voltage to the wordline of the non-volatile memory device. The method includes, in response to detecting that the write abort event occurred, reading data, based on the applied adjusted read level voltage, from the wordline of the non-volatile memory device.

In one or more aspects, a first voltage offset is determined based on one or more of a wordline zone, a wear-level indication of a non-volatile memory device, or one or more voltage parameters of a non-volatile memory device. In one or more aspects, a first voltage offset is determined based on one or more of a wordline zone, a wear-level indication of a non-volatile memory device, and one or more voltage parameters of a non-volatile memory device. In one example, a first voltage offset is based on a wordline zone. In one example, a first voltage offset is based on a wear-level indication of a non-volatile memory device. In one example, a first voltage offset is based on one or more voltage parameters of a non-volatile memory device. In one example, a first voltage offset is based on a wordline zone and a wear-level indication of a non-volatile memory device. In one example, a first voltage offset is based on a wordline zone and one or more voltage parameters of a non-volatile memory device. In one example, a first voltage offset is based on a wear-level indication of a non-volatile memory device and one or more voltage parameters of a non-volatile memory device. In one example, a first voltage offset is based on a wordline zone, a wear-level indication of a non-volatile memory device, and one or more voltage parameters of a non-volatile memory device.

It is understood that other configurations of the subject technology will become readily apparent to those skilled in the art from the detailed description herein, wherein various configurations of the subject technology are shown and described by way of illustration. The subject technology is capable of other and different configurations and its several details are capable of modification in various other respects, all without departing from the scope of the subject technology. Accordingly, the drawings and detailed description are to be regarded as illustrative in nature and not as restrictive.

Many of the above-described features of example process and related features and applications, may be implemented as software or firmware processes that are specified as a set of instructions recorded on a processor-readable storage medium (also referred to as computer-readable medium). When these instructions are executed by one or more processing unit(s) (e.g., one or more processors, cores of processors, or other processing units), the processing unit(s) are caused to perform the actions indicated in the instructions. Examples of processor-readable media include, but are not limited to, volatile memory, non-volatile memory, as well as other forms of media such as magnetic media, optical media, and electronic media. The processor-readable media does not include carrier waves and electronic signals communicated wirelessly or over wired connections.

The term "software" is meant to include, where appropriate, firmware residing in memory or applications stored in memory, which may be read into a working memory for processing by a processor. Also, in some implementations, multiple software aspects of the subject disclosure may be implemented as sub-parts of a larger program while remaining distinct software aspects of the subject disclosure. In some implementations, multiple software aspects may also be implemented as separate programs. Finally, any combination of separate programs that together implement a software aspect described here is within the scope of the subject disclosure. In some implementations, the software programs, when installed to operate on one or more electronic systems, define one or more specific machine implementations that execute and perform the operations of the software programs.

A computer program (also known as a program, software, software application, script, or code) may be written in any form of programming language, including compiled or interpreted languages, declarative or procedural languages, and it may be deployed in any form, including as a stand-alone program or as a module, component, subroutine, object, or other unit suitable for use in a computing environment. A computer program may, but need not, correspond to a file in a file system. A program may be stored in a portion of a file that holds other programs or data (e.g., one or more scripts stored in a markup language document), in a single file dedicated to the program in question, or in multiple coordinated files (e.g., files that store one or more modules, sub programs, or portions of code).

It is understood that illustrative blocks, modules, elements, components, methods, and algorithms described herein may be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject disclosure.

It is understood that the specific order or hierarchy of steps in the processes disclosed is presented as an illustration of some exemplary approaches. Based upon design preferences and/or other considerations, it is understood that the specific order or hierarchy of steps in the processes may be rearranged. For example, in some implementations some of the steps may be performed simultaneously. Thus the accompanying method claims present elements of the various steps in a sample order, and are not meant to be limited to the specific order or hierarchy presented.

The previous description is provided to enable any person skilled in the art to practice the various aspects described herein. The previous description provides various examples of the subject disclosure, and the subject disclosure is not limited to these examples. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

The predicate words "configured to", "operable to", and "programmed to" do not imply any particular tangible or intangible modification of a subject, but, rather, are intended to be used interchangeably. For example, a processor configured to monitor and control an operation or a component may also mean the processor being programmed to monitor and control the operation or the processor being operable to monitor and control the operation. Likewise, a processor configured to execute code may be construed as a processor programmed to execute code or operable to execute code.

The phrases "in communication with" and "coupled" mean in direct communication with or in indirect communication with via one or more components named or unnamed herein (e.g., a memory card reader)

A phrase such as an "aspect" does not imply that such aspect is essential to the subject disclosure or that such aspect applies to all configurations of the subject disclosure. A disclosure relating to an aspect may apply to all configurations, or one or more configurations. An aspect may provide one or more examples. A phrase such as an aspect may refer to one or more aspects and vice versa. A phrase such as an "implementation" does not imply that such implementation is essential to the subject disclosure or that such implementation applies to all configurations of the subject disclosure. A disclosure relating to an implementation may apply to all aspects, or one or more aspects. An implementation may provide one or more examples. A phrase such as an "implementation" may refer to one or more implementations and vice versa. A phrase such as a "configuration" does not imply that such configuration is essential to the subject disclosure or that such configuration applies to all configurations of the subject disclosure. A disclosure relating to a configuration may apply to all configurations, or one or more configurations. A configuration may provide one or more examples. A phrase such as a "configuration" may refer to one or more configurations and vice versa.

The word "exemplary" is used to mean "serving as an example or illustration." Any aspect or design described herein as "exemplary" is not necessarily to be construed as preferred or advantageous over other aspects or designs.

What is claimed is:

1. A data storage system, comprising:
  a non-volatile storage device comprising one or more wordlines configured to receive one or more read level voltages, wherein the one or more wordlines are associated with one or more wordline zones; and one or more controllers configured to cause:
detecting an occurrence of a write abort event;
determining a first voltage offset based on one or more of a wear-level indication of one or more memory blocks of the non-volatile storage device, a wordline zone, or one or more device characteristic parameters of the non-volatile storage device;
determining, based on the first voltage offset, an adjusted read level voltage;
applying the adjusted read level voltage to a wordline of the non-volatile storage device; and
reading data from the wordline based on the applied adjusted read level voltage.

2. The data storage system of claim 1, wherein the one or more controllers are configured to cause:
prior to determining the first voltage offset, identifying the wordline being programmed or about to be programmed when the write abort event occurs; and
determining the wordline zone associated with the wordline.

3. The data storage system of claim 2, wherein determining the first voltage offset comprises determining the first voltage offset based on the wordline zone associated with the wordline.

4. The data storage system of claim 2, wherein the one or more memory blocks comprise the wordline.

5. The data storage system of claim 1, wherein the one or more device characteristic parameters comprise one or more of a programming voltage parameter, or an erase voltage parameter.

6. The data storage system of claim 5,
wherein a programming voltage of the programming voltage parameter is based on a manufacturing variance of the non-volatile storage device, and
wherein an erase voltage of the erase voltage parameter is based on a manufacturing variance of the non-volatile storage device.

7. The data storage system of claim 1, wherein determining the first voltage offset comprises determining the first voltage offset based on the wordline zone and the wear-level indication of the one or more memory blocks of the non-volatile storage device.

8. The data storage system of claim 1, wherein determining the first voltage offset comprises:
determining a second voltage offset based on the wear-level indication;
determining a third voltage offset based on the wordline zone;
determining a fourth voltage offset based on the one or more device characteristic parameters; and
determining the first voltage offset based on one or more of the second voltage offset, the third voltage offset and the fourth voltage offset.

9. The data storage system of claim 1,
wherein the one or more controllers are configured to determine a first programming voltage based on the one or more device characteristic parameters of the non-volatile storage device, and
wherein the one or more controllers are configured to determine a first erase voltage based on the one or more device characteristic parameters of the non-volatile storage device.

10. The data storage system of claim 9, wherein the one or more controllers are configured to cause:
determining, based on the first programming voltage and the first erase voltage, a second voltage offset; and
determining, based on the first voltage offset and the second voltage offset, the adjusted read level voltage.

11. The data storage system of claim 1, wherein the one or more controllers are configured to cause:
determining, based on the read data, a number of errors of the wordline;
determining that the number of errors is less than a threshold number of errors; and
continuing programming of the wordline.

12. A method, comprising:
detecting an occurrence of a write abort event in a non-volatile storage device, wherein the non-volatile storage device comprises one or more wordlines configured to receive one or more read level voltages, wherein the one or more wordlines are associated with one or more wordline zones;
determining a first voltage offset based on one or more of a wear-level indication of one or more memory blocks of the non-volatile storage device, a wordline zone, or one or more device characteristic parameters of the non-volatile storage device;
determining, based on the first voltage offset, an adjusted read level voltage;
applying the adjusted read level voltage to a wordline of the non-volatile storage device; and
reading data from the wordline based on the adjusted read level voltage.

13. The method of claim 12, comprising:
identifying the wordline being programmed or about to be programmed when the write abort event occurs; and
determining the wordline zone associated with the wordline.

14. The method of claim 13, wherein determining the first voltage offset comprises determining the first voltage offset based on the wordline zone associated with the wordline.

15. The method of claim 12, wherein the one or more device characteristic parameters comprise one or more of a programming voltage parameter, or an erase voltage parameter.

16. The method of claim 15,
wherein a programming voltage of the programming voltage parameter is based on a manufacturing variance of the non-volatile storage device, and
wherein an erase voltage of the erase voltage parameter is based on a manufacturing variance of the non-volatile storage device.

17. An apparatus, comprising:
a non-volatile storage device comprising one or more wordlines configured to receive one or more read level voltages, wherein the one or more wordlines are associated with one or more wordline zones;
means for detecting an occurrence of a write abort event;
means for determining a first voltage offset based on one or more of a wear-level indication of one or more memory blocks of the non-volatile storage device, a wordline zone, or one or more device characteristic parameters of the non-volatile storage device;
means for determining, based on the first voltage offset, an adjusted read level voltage;
means for applying the adjusted read level voltage to a wordline of the non-volatile storage device; and
means for reading data from the wordline based on the applied adjusted read level voltage.

18. The apparatus of claim 17, comprising:
means for identifying the wordline being programmed or about to be programmed when the write abort event occurs; and means for determining the wordline zone associated with the wordline.

19. The apparatus of claim 18, wherein the means for determining the first voltage offset comprises means for determining the first voltage offset based on the wordline zone associated with the wordline.

20. The apparatus of claim 17, wherein the one or more device characteristic parameters comprise one or more of a programming voltage parameter, or an erase voltage parameter.

* * * * *